United States Patent
Goto et al.

(10) Patent No.: US 9,209,053 B2
(45) Date of Patent: Dec. 8, 2015

(54) MANUFACTURING METHOD OF A CONDUCTIVE SHIELD LAYER IN SEMICONDUCTOR DEVICE

(71) Applicant: KABUSHIKI KAISHA TOSHIBA, Minato-ku (JP)

(72) Inventors: Yoshiaki Goto, Kiyosu (JP); Takashi Imoto, Kamakura (JP); Takeshi Watanabe, Yokkaichi (JP); Yuusuke Takano, Yokkaichi (JP); Yusuke Akada, Mie (JP); Yuji Karakane, Nagoya (JP); Yoshinori Okayama, Yokohama (JP); Akihiko Yanagida, Zama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/482,378

(22) Filed: Sep. 10, 2014

(65) Prior Publication Data

US 2015/0171060 A1 Jun. 18, 2015

(30) Foreign Application Priority Data

Dec. 13, 2013 (JP) .................................. 2013-258705

(51) Int. Cl.
| | |
|---|---|
| *H01L 21/67* | (2006.01) |
| *H01L 21/673* | (2006.01) |
| *H01L 23/552* | (2006.01) |
| *H01L 23/00* | (2006.01) |

(52) U.S. Cl.
CPC .......... *H01L 21/67333* (2013.01); *H01L 21/67* (2013.01); *H01L 21/673* (2013.01); *H01L 23/552* (2013.01); *H01L 24/97* (2013.01); *H01L 24/29* (2013.01); *H01L 24/32* (2013.01); *H01L 24/48* (2013.01); *H01L 2224/2919* (2013.01); *H01L 2224/32225* (2013.01); *H01L 2224/45144* (2013.01); *H01L 2224/48091* (2013.01); *H01L 2224/48227* (2013.01); *H01L 2224/48228* (2013.01); *H01L 2224/48464* (2013.01); *H01L 2224/73265* (2013.01); *H01L 2224/97* (2013.01); *H01L 2924/157* (2013.01); *H01L 2924/15311* (2013.01)

(58) Field of Classification Search
CPC . H01L 21/67; H01L 21/673; H01L 21/67333; H01L 23/552; H01L 2924/3025; H01L 23/2525; H01L 2224/0345; H01L 2224/2745
See application file for complete search history.

(56) References Cited

U.S. PATENT DOCUMENTS

| | | | |
|---|---|---|---|
| 2012/0015687 A1 | 1/2012 | Yamada et al. | |
| 2015/0170988 A1* | 6/2015 | Watanabe | H01L 21/561 257/659 |

* cited by examiner

*Primary Examiner* — Thanhha Pham
(74) *Attorney, Agent, or Firm* — Oblon, McClelland, Maier & Neustadt, L.L.P.

(57) ABSTRACT

In a manufacturing method of a semiconductor device according to an embodiment, a plurality of semiconductor packages each including a semiconductor chip mounted on a wiring board and a sealing resin layer as objects to be processed, and a tray including a plurality of housing parts are prepared. A depressed portion having a non-penetrating shape or a penetrating shape is formed in the housing part. The semiconductor packages are disposed in the plural housing parts respectively. By sputtering a metal material on the semiconductor package housed in the tray, a conductive shield layer is formed.

10 Claims, 10 Drawing Sheets

(b)

US 9,209,053 B2

MANUFACTURING METHOD OF A CONDUCTIVE SHIELD LAYER IN SEMICONDUCTOR DEVICE

CROSS REFERENCE TO RELATED APPLICATION

This application is based upon and claims the benefit of priority from Japanese Patent Application No. 2013-258705, filed on Dec. 13, 2013; the entire contents of which are incorporated herein by reference.

FIELD

Embodiments disclosed here relate generally to a manufacturing method of a semiconductor device.

BACKGROUND

In a semiconductor device used in a communication device or the like, a structure in which a package surface is covered by a conductive shield layer is used in order to suppress an electromagnetic interference such as EMI (Electro Magnetic Interference). As a semiconductor device having a shielding function, there is known a structure having a conductive shield layer provided along an upper surface and a side surface of a sealing resin layer which seals a semiconductor chip. In the formation of the conductive shield layer, a plating method, a sputtering method, a coating method of conductive paste, or the like is used. Among the formation methods of the conductive shield layer, the plating method has wet steps such as a pre-treatment step, a plating step, and a water-washing step, so that an increase in a manufacturing cost of a semiconductor device is unavoidable. The coating method of conductive paste also easily causes the increase in a manufacturing cost of the semiconductor device, since it includes a coating step with respect to side surfaces of a sealing resin layer.

The sputtering method includes dry steps, so that it is possible to reduce the number of steps of formation, a formation cost and the like of the conductive shield layer. When the sputtering method is applied to the formation of the conductive shield layer, it is considered to form the conductive shield layer before dividing the semiconductor packages into pieces. In such a case, semiconductor chips are first mounted on respective wiring board regions of a multi-cavity integrated board, and next, the semiconductor chips are collectively resin-sealed. Subsequently, the sealing resin layer and a part of the integrated board are cut to form a half-cut groove. The half-cut groove is formed to make a ground wiring line of the wiring board region to be exposed to a side surface. By sputtering a metal material on the resin-sealed body having the half-cut groove, the conductive shield layer is formed. On side surface of the sealing resin layer and a part of side surface of the wiring board region, the metal material is sputtered via the half-cut groove.

A width of the half-cut groove is limited. Therefore, when the metal material is sputtered via the half-cut groove, there is a possibility that an adjacent package becomes an obstacle, and that the side surface of the sealing resin layer and the wiring board region cannot be sufficiently covered by the conductive shield layer. If the side surface of the sealing resin layer and the wiring board region are covered by the conductive shield layer with a sufficient thickness, the metal material is deposited thickly on an upper surface of the sealing resin layer in which no obstacle exists. This becomes a main cause of increasing the formation cost of the conductive shield layer. Regarding the half-cut of the integrated board with a small thickness, it is difficult to control of a depth of cut, and depending on circumstances, there is a possibility that the semiconductor packages are divided into pieces. From the circumstances as above, when forming the conductive shield layer on the package surface by applying the sputtering method, a technique to forming the conductive shield layer more surely and with a lower cost, is required.

DETAILED DESCRIPTION

According to one embodiment, there is provided a manufacturing method of a semiconductor device, the method including: preparing a plurality of objects to be processed each including a wiring board, a semiconductor chip mounted on the wiring board, and a sealing resin layer sealing the semiconductor chip; preparing a tray including a plurality of housing parts and depressed portions provided in the plural housing parts respectively; disposing in each of the plural housing parts of the tray, the object so that an upper surface and side surfaces of the sealing resin layer and at least a part of side surfaces of the wiring board when a surface of the wiring board on which the semiconductor chip is mounted is defined as an upper side are exposed; disposing the tray in which the objects are housed on a table of a sputtering apparatus; and forming a conductive shield layer which covers the upper surface and the side surfaces of the sealing resin layer and at least a part of the side surfaces of the wiring board by sputtering a metal material on the object housed in each of the housing parts of the tray in the sputtering apparatus. The depressed portion provided in the housing part of the tray has a non-penetrating shape or a penetrating shape. When the tray including the depressed portion with the non-penetrating shape is used, the tray which the objects are housed is directly disposed on the table of the sputtering apparatus. When the tray including the depressed portion with the penetrating shape is used, the tray which the objects are housed is disposed on the table of the sputtering apparatus via an adhesion preventing plate.

First Embodiment (Semiconductor Device)

Figure 1:
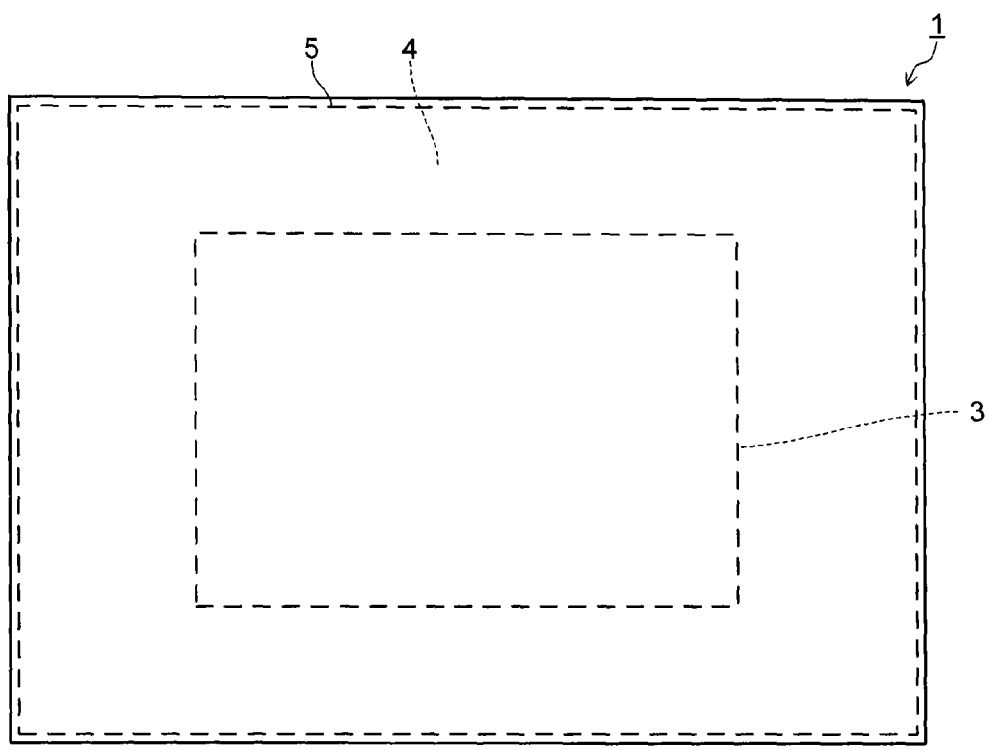
FIG. 1 is a top view illustrating a semiconductor device manufactured by a manufacturing method of a first embodiment.
Figure 2:
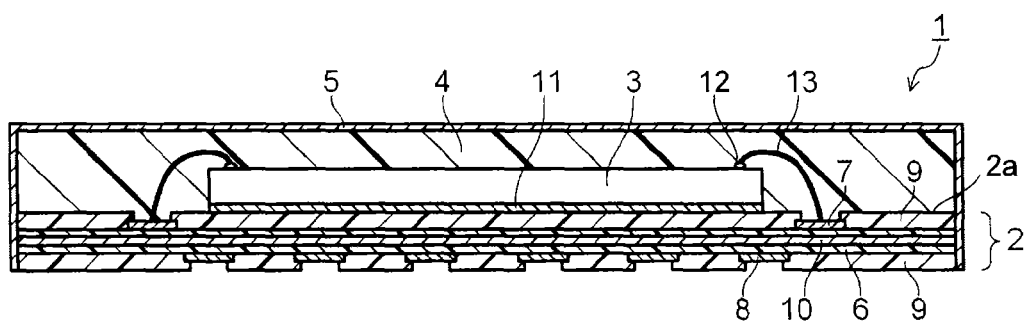
FIG. 2 is a sectional view of the semiconductor device illustrated in FIG. 1.

A semiconductor device manufactured by a manufacturing method of a first embodiment will be described with reference to FIG. 1 and FIG. 2. FIG. 1 is a top view of the semiconductor device, and FIG. 2 is a sectional view of the semiconductor device. A semiconductor device 1 shown in the these drawings is a semiconductor device having a shielding function, the semiconductor device includes a wiring board 2, a semiconductor chip 3 mounted on a first surface 2a of the wiring board 2, a sealing resin layer 4 sealing the semiconductor chip 3, and a conductive shield layer 5 covering an upper surface and side surfaces of the sealing resin layer 4 and at least a part of side surfaces of the wiring board 2. Upper and lower directions as mentioned in the upper surface of the sealing resin layer 4 or the like are based on a case where a surface of the wiring board 2 on which the semiconductor chip 3 is mounted is defined as an upper side.

The wiring board 2 has an insulating resin substrate as an insulating substrate 6. A first wiring layer having internal connection terminals 7 to be an electrical connection part with the semiconductor chip 3 is provided on an upper surface of the insulating substrate 6. A second wiring layer having external connection terminals 8 to be an electrical connection part with an external device is provided on a lower surface of the insulating substrate 6. Solder resist layers 9 are formed on the first and second wiring layers, respectively. The wiring board 2 may also be a silicon interposer or the like. The first wiring layer and the second wiring layer are electrically connected through a via (not shown) provided in a manner to penetrate the insulating substrate 6, for example. A wiring network of the wiring board 2 including the first and second wiring layers and the via has a ground wiring line in which a part thereof is exposed to a side surface of the insulating substrate 6.

In FIG. 2, a ground wiring line 10 of a solid film shape (or of a mesh film shape) formed inside the insulating substrate 6 is shown. The ground wiring line 10 prevents a leakage of an unnecessary electromagnetic wave to outside via the wiring board 2. An end portion of the ground wiring line 10 is exposed to the side surface of the insulating substrate 6. A portion of the ground wiring line 10 exposed from the insulating substrate 6 becomes an electrical connection part with the conductive shield layer 5. The ground wiring line 10 of the solid film shape is shown here, but a shape of the ground wiring line 10 is not limited thereto. The ground wiring line exposed from the side surface of the insulating substrate 6 may also be a via. When the via as the ground wiring line is to be exposed from the side surface of the insulating substrate 6, it is preferable that at least a part of the via is cut in a thickness direction of the insulating substrate 6, and the cut surface is exposed to the side surface of the insulating substrate 6, in order to increase an exposed area.

The semiconductor chip 3 is mounted on the first surface 2a of the wiring board 2. The semiconductor chip 3 is adhered to the first surface 2a of the wiring board 2 via a adhesive layer 11. Electrode pads 12 provided on an upper surface of the semiconductor chip 3 are electrically connected to the internal connection terminals 7 of the wiring board 2 via bonding wires 13 such as Au wires. Further, the sealing resin layer 4 sealing the semiconductor chip 3 together with the bonding wires 13 or the like is formed on the first surface 2a of the wiring board 2. The upper surface and the side surfaces of the sealing resin layer 4 and at least a part of the side surfaces of the wiring substrate 2 are covered by the conductive shield layer 5. The conductive shield layer 5 is electrically connected to the portion of the ground wiring line 10 exposed from the side surface of the insulating substrate 6.

The conductive shield layer 5 prevents an unnecessary electromagnetic wave emitted from the semiconductor chip 3 in the sealing resin layer 4 and the wiring layers of the wiring board 2 from leaking out, and prevents an electromagnetic wave emitted from an external device from adversely affecting the semiconductor chip 3. The conductive shield layer 5 is preferable to be made of a metal material layer with a low resistivity. For the conductive shield layer 5, at least one metal selected from copper, silver, and nickel, or an alloy which contains at least one of the metal elements is used, for example. A thickness of the conductive shield layer 5 is preferable to be set based on its resistivity. The thickness of the conductive shield layer 5 is preferable to be set so that a sheet resistance value obtained by dividing the resistivity of the conductive shield layer 5 by the thickness becomes 0.5Ω or less. By setting the sheet resistance value of the conductive shield layer 5 to 0.5Ω or less, it is possible to suppress the leakage of the unnecessary electromagnetic wave from the sealing resin layer 4 and the invasion of the electromagnetic wave emitted from the external device to the inside of the sealing resin layer 4, with good repeatability.

The unnecessary electromagnetic wave emitted from the semiconductor chip 3 or the like and the electromagnetic wave emitted from the external device are shielded by the conductive shield layer 5 covering the sealing resin layer 4. Therefore, it is possible to suppress the leakage of the unnecessary electromagnetic wave to the outside via the sealing resin layer 4 and the invasion of the electromagnetic wave from the outside into the sealing resin layer 4. The electromagnetic wave may leak or invade also from the side surfaces of the wiring board 2. For this reason, it is preferable that the conductive shield layer 5 covers the entire side surfaces of the wiring board 2. FIG. 2 shows a state where the entire side surfaces of the wiring board 2 are covered by the conductive shield layer 5. Thereby, it is possible to suppress the leakage and invasion of the electromagnetic wave from the side surfaces of the wiring board 2 effectively. Though not shown in FIG. 2, it is also possible to cover the conductive shield layer 5, as necessary, by a protective layer (for example, an iron-based protective layer such as a stainless steel layer) which is excellent in a corrosion resistance or a migration resistance.

(Manufacturing Method of Semiconductor Device)

A manufacturing process of the semiconductor device 1 according to the first embodiment will be described. First, steps before forming the conductive shield layer 5 are carried out, thereby fabricating a semiconductor package 20 having no conductive shield layer 5 shown in FIG. 3. In other words, the semiconductor package 20 having no conductive shield layer 5 is fabricated as an object to be processed in a formation step (a sputtering deposition step) of the conductive shield layer 5 to which a sputtering method is applied. The semiconductor package 20 having no conductive shield layer 5 is fabricated as below, for example.

Figure 3:
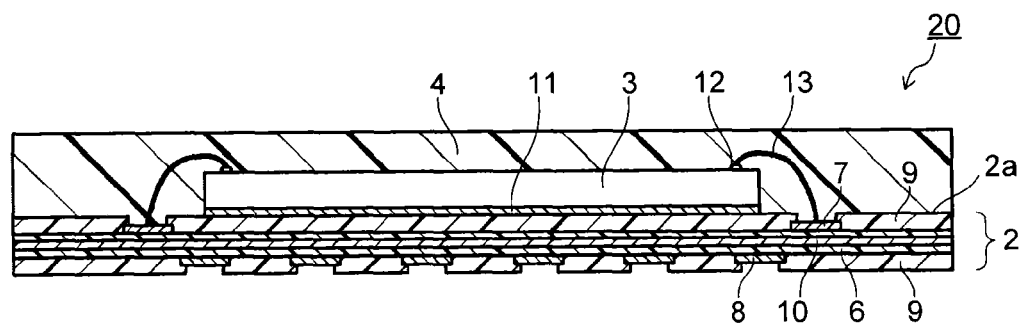
FIG. 3 is a sectional view illustrating a state before a conductive shield layer of the semiconductor device illustrated shown in FIG. 1 is formed.

The semiconductor chips 3 are respectively mounted on wiring board regions (2) of a multi-cavity integrated board. The internal connection terminals 7 of the respective wiring board region (2) and the electrode pads 12 of the semiconductor chip 3 are electrically connected via the bonding wires 13. The plurality of semiconductor chips 3 mounted on the multi-cavity integrated board are resin-sealed collectively. The resin-sealed body including the plural semiconductor chips 3 is diced along the wiring board regions (2). Specifically, the resin-sealed body including the integrated board and the sealing resin layer is cut, and the semiconductor packages 20 for a previous stage of forming the conductive shield layer 5 are divided into pieces. FIG. 3 shows the semiconductor package 20 in the form of individual piece.

In the formation step (sputtering step) of the conductive shield layer 5, the semiconductor package 20 in the form of individual piece is used as the object. The plurality of semiconductor packages 20 as the objects are housed in a tray to be sent to the sputtering step, and are subjected to the sputtering step under the state. The tray for the sputtering step has a plurality of housing parts in which the objects are housed. The tray is preferable to be formed out of a heat-resistant resin material such as polyphenylene ether (PPE) and polyphenylene sulfide (PPS), or a high thermal conductivity material such as aluminum and duralumin, for example.

The semiconductor packages 20 are disposed in the plural housing parts provided in the tray in a manner that the upper surface and the side surfaces of the sealing resin layer 4 and at least a part of the side surfaces of the wiring board 2 are exposed. A metal material as a forming material of the conductive shield layer 5 is sputtered on the semiconductor packages 20 housed in the tray. Thereby, the conductive shield layer 5 covering the upper surface and the side surfaces of the sealing resin layer 4 and at least the part of the side surfaces of the wiring board 2 is formed on each of the semiconductor packages 20 in the form of individual piece.

Figure 4:
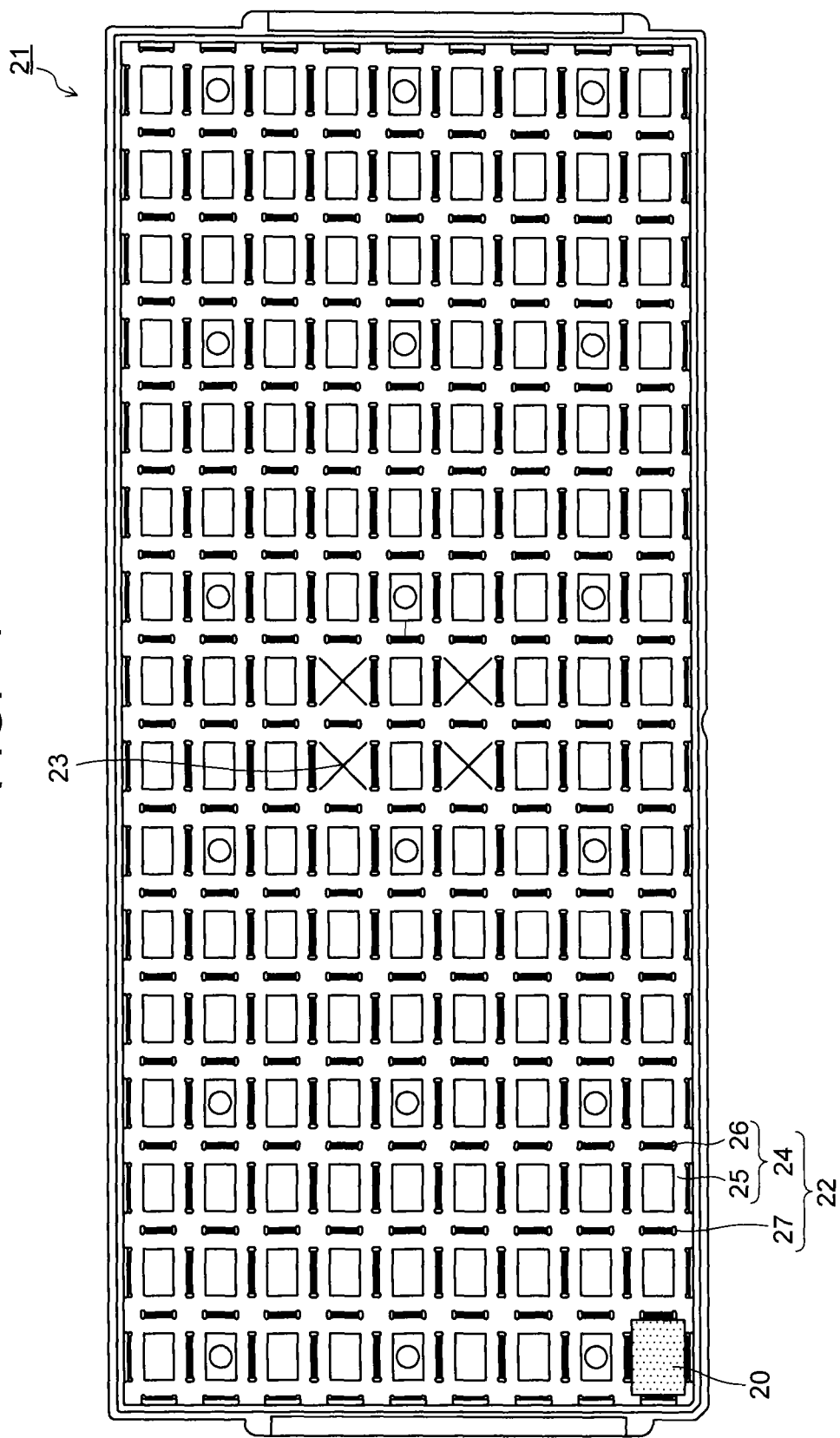
FIG. 4 is a plan view illustrating a tray used in the manufacturing method of the first embodiment.
Figure 5:
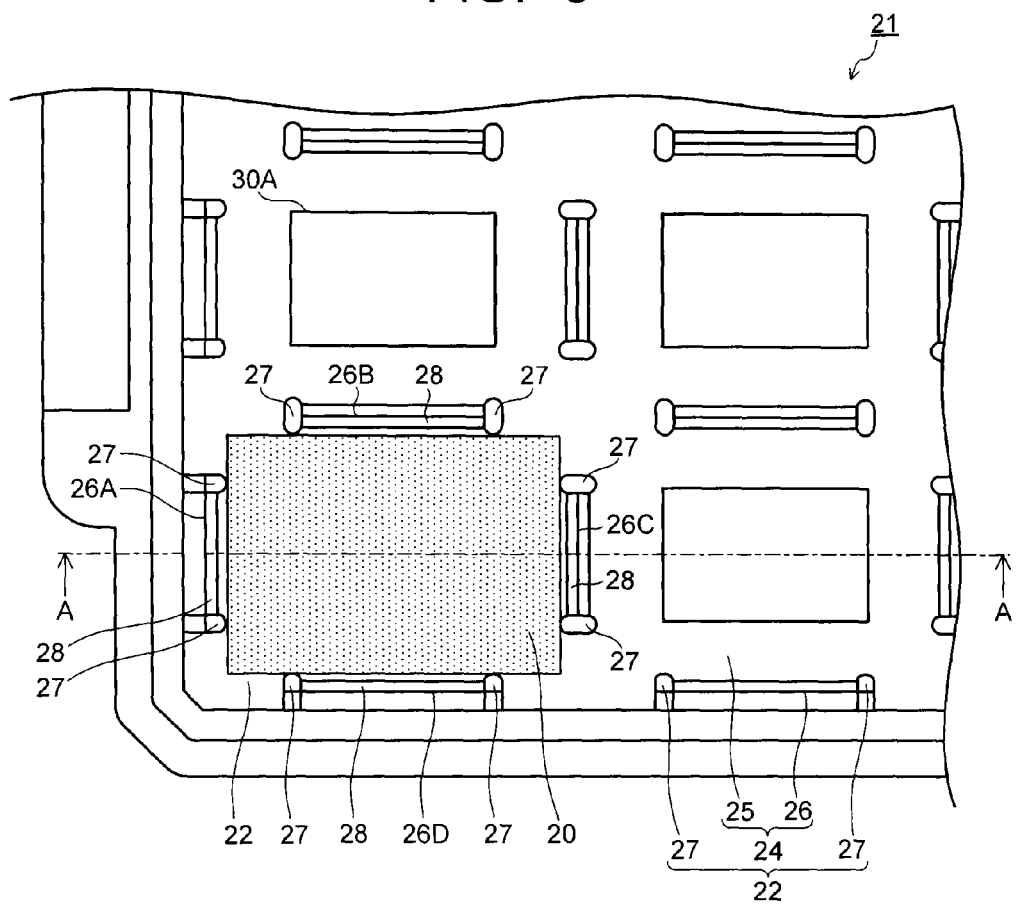
FIG. 5 is a plan view illustrating, in an enlarged manner, a part of the tray illustrated in FIG. 4.
Figure 6:
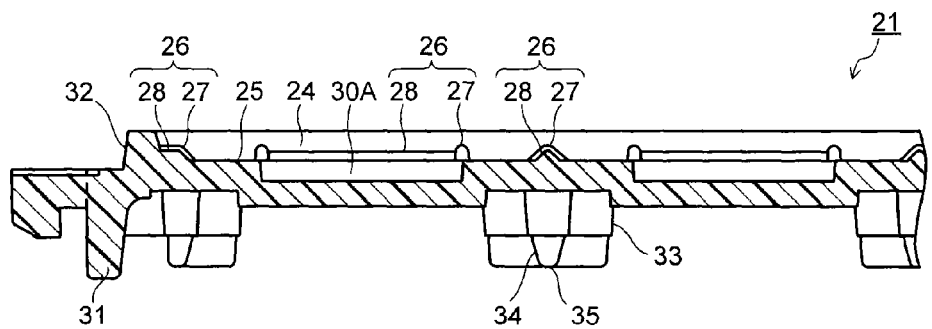
FIG. 6 is a sectional view taken along a line A-A of FIG. 5.

FIG. 4 to FIG. 6 show a tray 21 for the sputtering step. FIG. 4 is a plan view of the tray 21, FIG. 5 is a plan view enlargedly showing a part of the tray 21, and FIG. 6 is a cross-sectional view taken along a line A-A in FIG. 5. In FIG. 6, an illustration of the semiconductor package 20 is omitted. The tray 21 shown in these drawings inclds a plurality of housing regions 22. The tray 21 shown in FIG. 4 has 144 forming regions of the housing parts 22, but four forming regions in a vicinity of a center are suction parts 23 for transportation. The housing part 22 has a recessed portion 24 in which the semiconductor package 20 is disposed. The recessed portion 24 has a rectangular planar shape (a planar shape of the entire recessed portion 24 in a top view) larger than the semiconductor package 20, so that the rectangular semiconductor package 20 can be housed.

The recessed portion 24 is constituted with a rectangular bottom surface 25 which is larger than the semiconductor package 20 and a wall portion 26 provided along a part of an outer edge of the bottom surface 25. A circumference of the bottom surface 25 in which the semiconductor package 20 is disposed is surrounded by wall portions 26A, 26B, 26C, 26D provided along a part of each of the four outer edges of the rectangular bottom surface 25. The wall portions 26A, 26B, 26C, 26D are provided partially along a part of each of the four outer edges of the bottom surface 25, and each have a length equivalent to a part of each of the four outer edges.

A depth of the recessed portion 24 is set to be shallow in a range where an upper surface of the semiconductor package 20 dose not protrude from the tray 21, so as not to hinder a sputtering property of the metal material to the side surfaces of the sealing resin layer 4 and the wiring board 2. When a semiconductor package 20 with a thickness of 1 mm is disposed in a recessed portion 24, the recessed portion 24 whose depth from the upper surface of the tray 21 is 1.2 mm, for example, is applied. A height of the wall portion 26 is preferably set to be lower than a thickness of the semiconductor package 20.

In order to increase the sputtering property of the metal material with respect to the side surfaces of the sealing resin layer 4 and the wiring board 2 of the semiconductor package 20 in the sputtering step, the bottom surface 25 of the recessed portion 24 has a planar shape larger than the semiconductor package 20. With only the recessed portion 24 having such a shape, the formability of the conductive shield layer 5 to a part of the side surfaces of the sealing resin layer 4 and the wiring board 2 is lowered when the semiconductor package 20 is disposed by being biased. Thus, the four wall portions 26A, 26B, 26C, 26D surrounding the bottom surface 25 of the recessed portion 24 each have a rib 27 as a positioning portion of the semiconductor package 20. Two ribs 27 are formed on each of the wall portions 26A, 26B, 26C, 26D. The respective side surfaces of the semiconductor package 20 are positioned by a plurality of the ribs 27, thereby a positioning accuracy of the rectangular semiconductor package 20 can be increased.

The ribs 27 are provided in both ends of each of the wall portions 26A, 26B, 26C, 26D, in a manner to protrude from the wall portion 26 toward an inner side of the recessed portion 24. The rib 27 has a shape inclined from an upper portion of the wall portion 26 toward the inner side of the recessed portion 24. A lower end (a tip) of the rib 27 having an inclined shape corresponds to an outer shape of the semiconductor package 20. Therefore, the semiconductor package 20 housed in the recessed portion 24 is positioned by sliding down to the bottom surface 25 of the recessed portion 24 along the rib 27 having the inclined shape. An inclination angle (an angle between the bottom surface and an inclined surface) of the rib 27 is preferable to be set in a range of 35 to 50 degrees in consideration of a positioning property of the semiconductor package 20 and a deposition property of the metal material.

In order to improve the positioning property of the semiconductor package 20, a smallest corner R of the tip of the rib 27 is set to be as small as possible. When the molding of the tray 21 using the resin material is repeated, there is a possibility that a position, corresponding to the corner R, of a mold is worn out, resulting in that the corner R is enlarged. With respect to such a point, it is also effective to form a dug-portion in front of the tip of the rib 27. A width of the rib 27 is narrowed and a top portion thereof is made to have a curved shape (an arc or the like) in order to improve the sputtering property of the metal material to the respective side surfaces of the sealing resin layer 4 and the wiring board 2. Further, a height of the rib 27 is set to be smaller than that of the upper surface of the semiconductor package 20 disposed in the recessed portion 24.

A convex portion 28 is provided between the two ribs 27, in order to prevent such a rib 27 from being broken off or to prevent a warpage after the tray 21 is injection-molded by using a resin material. The wall portion 26 is constituted with the convex portion 28 and the ribs 27 provided at the both ends of the convex portion 28. The convex portion 28 supports the rib 27 and has a strength to prevent the warpage or the like of the tray 21. A height of the convex portion 28 is preferable to be made small in a range where a supporting property and a strength of the rib 27 can be maintained. The convex portion 28 has a shape whose height is smaller than that of the rib 27 and whose end is recessed from the end of the rib 27.

The convex portion 28 has an inclined shape (for example, a triangular shape in cross section) comparatively smaller than the rib 27 in the inclined shape. A concrete height of the convex portion 28 is preferably set to be high within a range in which the height does not exceed a line connecting a lower end portion of one semiconductor package 20 and an upper end portion of an adjacent semiconductor package 20. Even if the height of the convex portion 28 is set to be lower than the range, the deposition property of the metal material is not improved. It is preferable to make the height of the convex portion 28 large within the range to improve a strength of the convex portion 28.

Figure 7:
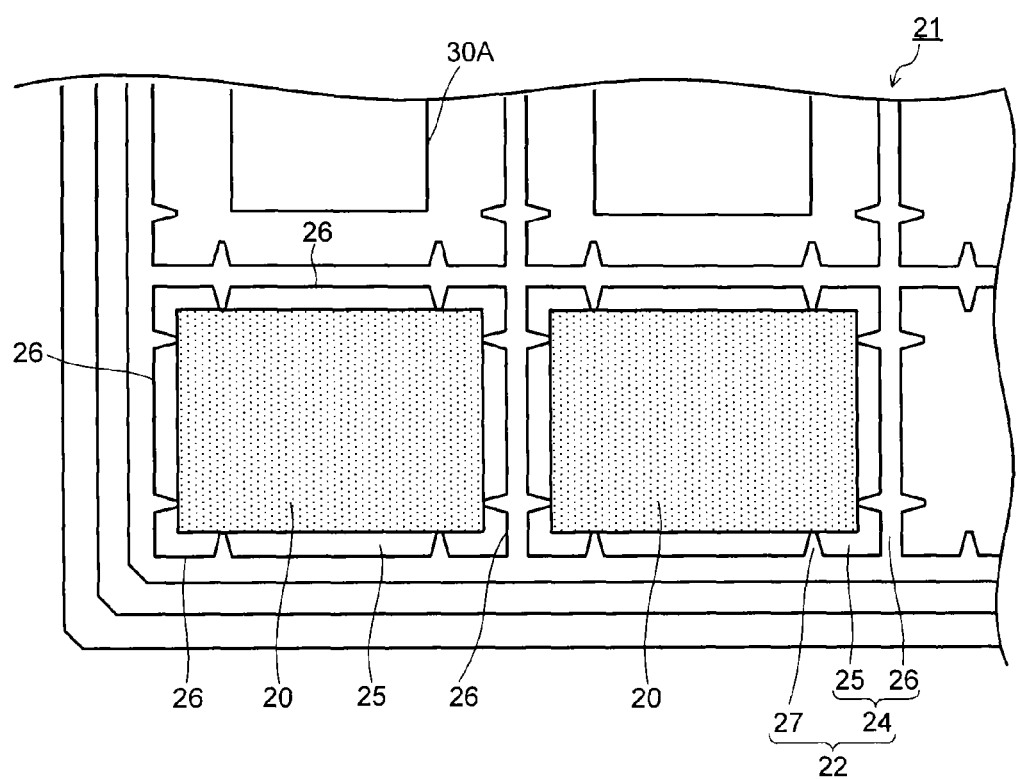
FIG. 7 is a plan view illustrating a first modification example of the tray illustrated in FIG. 4 to FIG. 6.
Figure 8:
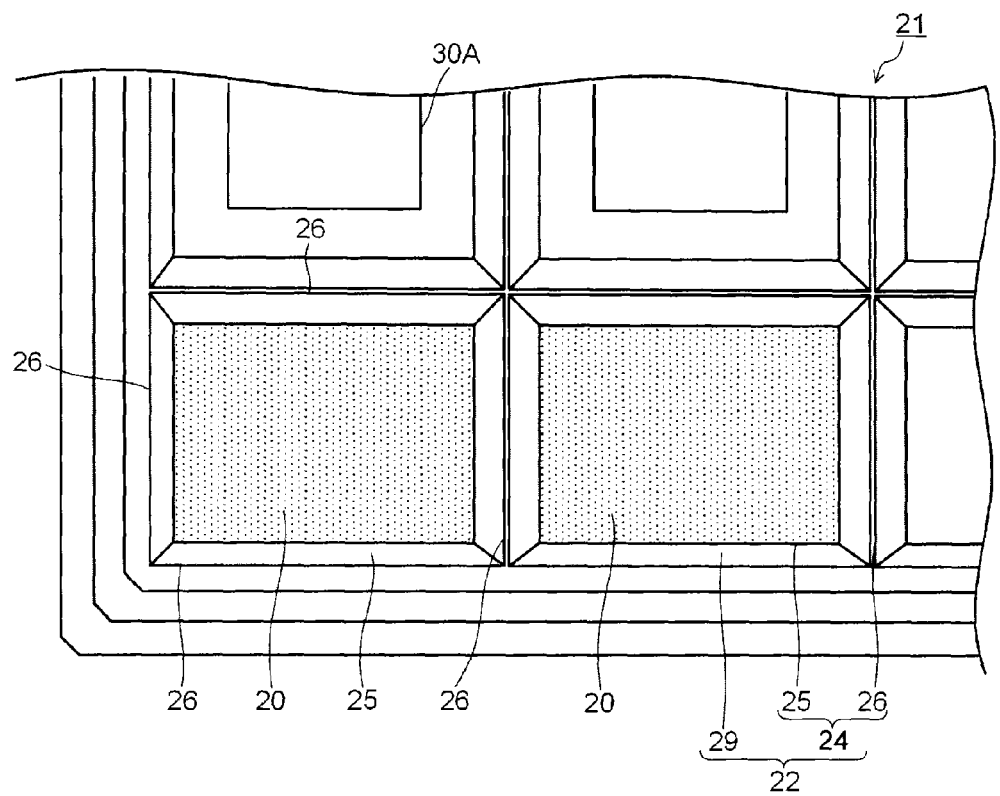
FIG. 8 is a plan view illustrating a second modification example of the tray illustrated in FIG. 4 to FIG. 6.

The shapes of the wall portion 26 and the rib (positioning portion) 27 are not limited to the shapes described above. FIG. 7 and FIG. 8 show trays 21 having the wall portion 26 surrounding entire circumference of the recessed portion 24. The wall portions 26 are provided along four outer edges of the rectangular bottom surface 25. The tray 21 shown in FIG. 7 has the ribs 27 projecting from the inner wall surfaces of the wall portions 26 toward the inner side of the recessed portion 24, as a positioning portion of the semiconductor package 20. Each of the inner wall surfaces of the wall portion 26 is provided with a plurality of the ribs 27. The tips of the ribs 27 correspond to an outer shape of a semiconductor package 20. The semiconductor package 20 disposed in a recessed portion 24 is positioned by the tips of the ribs 27.

The tray 21 shown in FIG. 8 has a inclined portion (an inclined surface) 29 provided as a positioning portion of a semiconductor package 20 in each of inner wall surfaces of the wall portions 26. The inclined portion 29 is provided in a manner to be inclined from an upper end of the wall portion 26 toward an inner side of the recessed portion 24. In other words, the inclined portions 29 are provided in a manner that an entire shape of the recessed portion 24 in a plan view becomes larger than the bottom surface 25. The bottom surface 25 of the recessed portion 24 defined by lower ends of the inclined portions 29 corresponds to an outer shape of the semiconductor package 20. The semiconductor package 20 housed in the recessed portion 24 is positioned as a result of sliding down the inclined portion (the inclined surface) 29 to the bottom surface 25 of the recessed portion 24.

The housing part 22 of the semiconductor 20 has a depressed portion 30 provided in the recessed portion 24. FIG. 5 to FIG. 8 show depressed portions 30A having non-penetrating shapes. The trays 21 shown in FIG. 5 to FIG. 8 have non-penetrating holes 30A having bottom surfaces as the depressed portions 30. The depressed portion 30 contributes to improvement of a strength of the tray 21. As a result that a solid volume of the tray 21 when the tray 21 is fabricated out of a resin material is reduced by the depressed portion 30 to decrease a usage amount of the resin material, a manufacturing cost of the tray 21 can be curtailed. Further, the depressed portion 30 can lead to reduction of a weight of the tray 21. The tray 21 is basically reused as a material or discarded after one sputtering step is performed. Therefore, reduction of a material cost of the tray 21 contributes to reduction of a cost of the sputtering step. Further, reduction of a weight of the tray 21 can also bring about reduction of a transfer cost of the semiconductor package 20.

Figure 9:
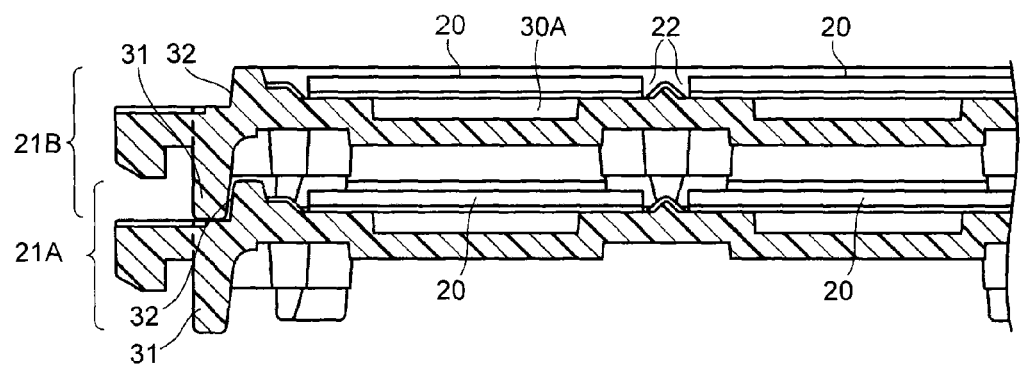
FIG. 9 is a sectional view illustrating a state where the trays illustrated in FIG. 4 to FIG. 6 are stacked.

The tray 21 to house the semiconductor package 20 is capable of being stacked in consideration of handleability and carriability. FIG. 9 shows a state where a plurality of the trays 21 (21A, 21B) are stacked. In order to prevent displacement at a time of stacking the plural trays 21 and displacement of the semiconductor package 20 caused thereby, the tray 21 has a first engaging part 31 provided in a lower surface side and a second engaging part 32 provided in an upper surface side. The tray 21 shown in FIG. 6 and FIG. 9 has a projecting part as the first engaging part 31 and a recessed part as the second engaging part 32. When the plural trays 21A, 21B are stacked, the first engaging part (projecting part) 31 of the tray 21B in an upper side is engaged to the second engaging part (recessed part) 32 of the tray 21A in a lower side. Displacement or the like of the trays 21 at the time that the plural trays 21A, 21B are stacked is prevented.

Figure 10A:
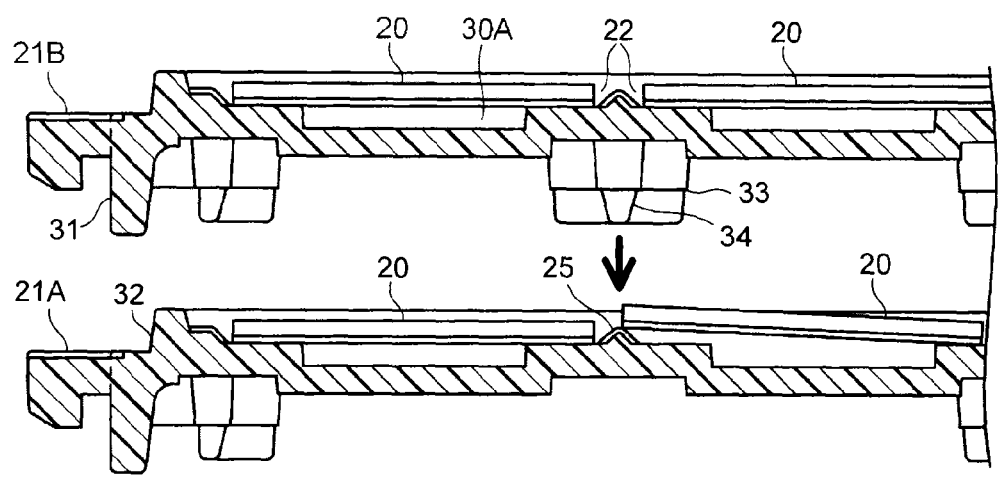
FIG. 10A and FIG. 10B are sectional views illustrating states where a position of an object is corrected by a position correction part of the tray illustrated in FIG. 4 to FIG. 6.
Figure 10B:
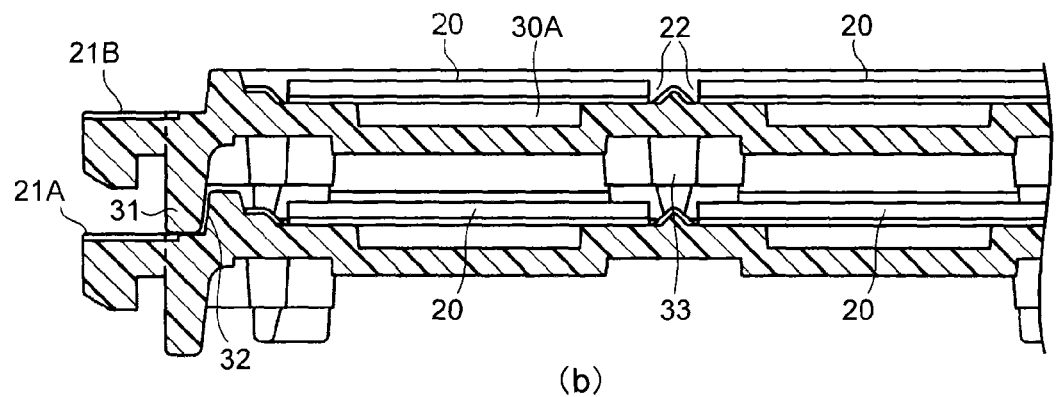

In the lower surface side of the tray 21 shown in FIG. 6, a position correction part 33 for the object is provided. The position correction part 33 has a taper portion 34 whose end is R-shaped. As shown in FIG. 10A, an end of the semiconductor package 20 housed in the housing part 22 of a tray 21A sometimes overlaps on a wall portion 26. As shown in FIG. 10B, when a tray 21B is stacked thereon, the semiconductor package 20 in the tray 21A is pressed down by the taper portion 34 of the positioning portion 33. Therefore, the semiconductor package 20 is disposed in a normal position in the housing part 22. A height of the wall portion 26 is lower than that of an upper surface of the semiconductor package 20 disposed in the recessed portion 24. The semiconductor package 20 whose end portion overlaps on the wall portion 26 is pressed down to the normal position by the position correction part 33 of the upper tray 21B.

Figure 11A:
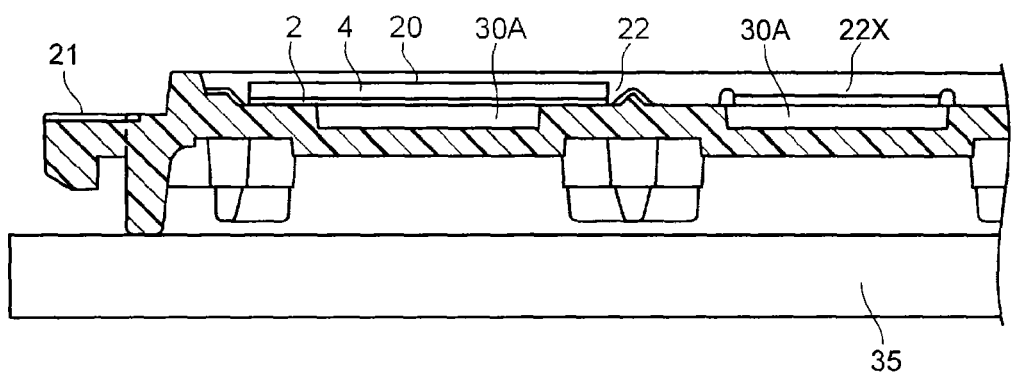
FIG. 11A and FIG. 11B are sectional views illustrating a manufacturing process of the semiconductor device according to the first embodiment.
Figure 11B:
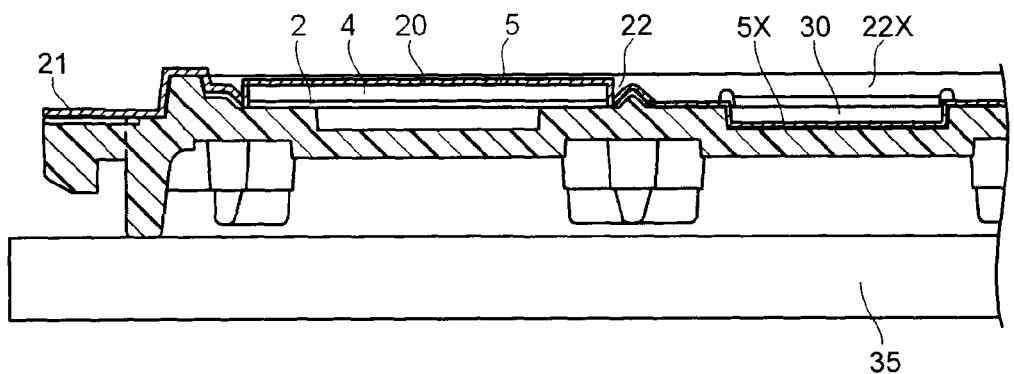

As shown in FIG. 11A, the semiconductor packages 20 as the objects are disposed in the housing parts 22 of the tray 21 and are transferred to a sputtering step. The tray 21 in which the semiconductor packages 20 are housed is disposed on a table 35 of a sputtering apparatus (an entire structure of the sputtering apparatus is not shown). As shown in FIG. 11B, as a result that sputtering is carried out in a state where the semiconductor package 20 is housed in the tray 21, the conductive shield layer 5 covering the upper surface and the side surfaces of the sealing resin layer 4 and the side surface of the wiring board 2 is formed. A housing part 22X is sometimes generated in which the semiconductor package 20 is not disposed, depending on the number of the semiconductor packages 20 to be processed. Also in such a case, since a depressed portion 30 is a non-penetrating hole 30A having a bottom surface, an unnecessary metal film 5X does not contaminate the table 35 of the sputtering apparatus though the unnecessary metal film 5X adheres to the inside of the depressed portion 30. Therefore, it is possible to reduce a cost necessary for cleaning or exchange of the table 35.

Second Embodiment

Figure 12:
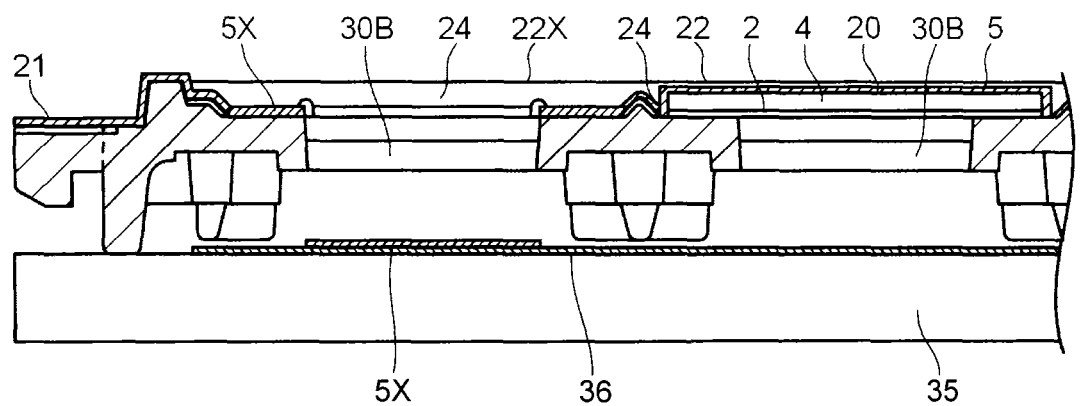
FIG. 12 is a sectional view illustrating a tray used in a manufacturing method of a second embodiment and a manufacturing process of a semiconductor device using the same.

Next, a second embodiment will be described with reference to FIG. 12. FIG. 12 shows a tray 21 which includes a depressed portion 30 having a penetrating shape. The tray 21 shown in FIG. 12 has a penetrating hole 30B as the depressed portion 30. A configuration except a shape of the depressed portion 30 of the tray 21 shown in FIG. 12 is similar to that of the tray 21 used in the first embodiment. FIG. 12 shows a sputtering step in which the tray 21 having the penetrating hole 30B as the depressed portion 30 is used.

When the depressed portion 30 is the penetrating hole 30B, a usage amount of the resin material is further decreased compared with a case of the non-penetrating hole 30A. By the penetrating hole 30B, it is possible to obtain an effect as the depressed portion 30 for amount reduction more effectively. A weight reduction effect of the tray 21 is also large. However, in a case where the penetrating hole 30B is applied, if a housing part 22X occurs where a semiconductor package 20 is not disposed, an unnecessary metal film 5X adheres to the table 35 of the sputtering apparatus and contamination occurs. When the depressed portion 30 made of the penetrating hole 30A is applied, an adhesion preventing plate 36 is put on the table 35 of the sputtering apparatus and the tray 21 in which the semiconductor packages 20 are housed is disposed on the table 35 via the adhesion preventing plate 36.

The tray 21 shown in FIG. 12 has the penetrating hole 30B provided in each of the plurality of recessed portions 24 as the depressed portion 30 for amount reduction. The tray 21 in which the semiconductor packages 20 are housed is disposed on the adhesion preventing plate 36 arranged on the table 35 of the sputtering apparatus. Even if the housing part 22X in which the semiconductor package 20 is not disposed occurs, sputtered particles having passed through the penetrating hole 30A are deposited on the adhesion preventing plate 36. The unnecessary metal film 5X is formed on the adhesion preventing plate 36. Therefore, the table 35 of the sputtering apparatus is not contaminated by the unnecessary metal film 5X. Though a man-hour for disposition or exchange of the adhesion preventing plate 36 occurs, a cost can be decreased compared with a man-hour for cleaning or exchange of the table 35 of the sputtering apparatus. The adhesion preventing plate 36 is only for preventing adhesion of the unnecessary metal film 5X to the table 35, and thereby, it is possible to use a stainless steel plate or the like which is easy to wash.

In the manufacturing methods of the first and second embodiments, the sputtering step is performed in a state where the semiconductor packages 20 are housed in the tray 21, and thereby, it is possible to improve handleability of the semiconductor packages 20 in the form of individual pieces in the sputtering step. Therefore, when compared to the sputtering step performed by using the half-cut groove, it is possible to prevent reduction in workability due to control of depth in the dicing step and increase of the man-hour by performing the dicing steps twice. The sputtering step using the half-cut groove not only increases the man-hour for the dicing step as stated above but also is inferior in formability of the conductive shield layer to the side surfaces or the like of the sealing resin layer.

In contrast to the above points, when the semiconductor package 20 is subjected to the sputtering step in a state of being housed in the tray 21, formability of the conductive shield layer 5 to the side surfaces of the sealing resin layer 4 and the wiring board 2 is improved by a shape of the housing part 22 of the tray 21, more specifically, shapes of the depressed portion 24, the bottom surface 25, the wall portion 26, the rib 27 and the like. In other words, it is possible to form the conductive shield layer 5 having a thickness necessary for obtaining a shield effect in the surfaces of the sealing resin layer 4 and the wiring board 2 without making a thickness of the conductive shield layer 5 formed on an upper surface of the sealing resin layer 4 large. Therefore, it is possible to suppress increase of a material cost necessary for formation of the conductive shield layer 5. Thereby, it becomes possible to improve formability of the conductive shield layer 5 to the semiconductor package 20 and to reduce the man-hour for formation and the formation cost of the conductive shield layer 5.

Further, in the manufacturing method of the first embodiment, the tray 21 having the depressed portion 30A of the non-penetrating shape is used. In the manufacturing method of the second embodiment, the tray 21 having the depressed portion 30B of the penetrating shape is used. By the tray 21 having the depressed portion 30, a manufacturing cost of the tray 21 can be reduced. In a case of the tray 21 having the non-penetrating hole 30A, contamination of the table 35 of the sputtering apparatus due to the housing part 22X where the semiconductor package 20 is not disposed does not occur even if the tray is subjected to the sputtering step as it is. In a case of the tray 21 having the penetrating hole 30B, contamination of the table 35 of the sputtering apparatus due to the housing part 22X where the semiconductor package 20 is not disposed does not occur by disposing the tray 21 on the table 35 of the sputtering apparatus via the adhesion preventing plate 36. Increase of a man-hour and a cost necessary for the sputtering step can be suppressed.

Third Embodiment

Figure 13:
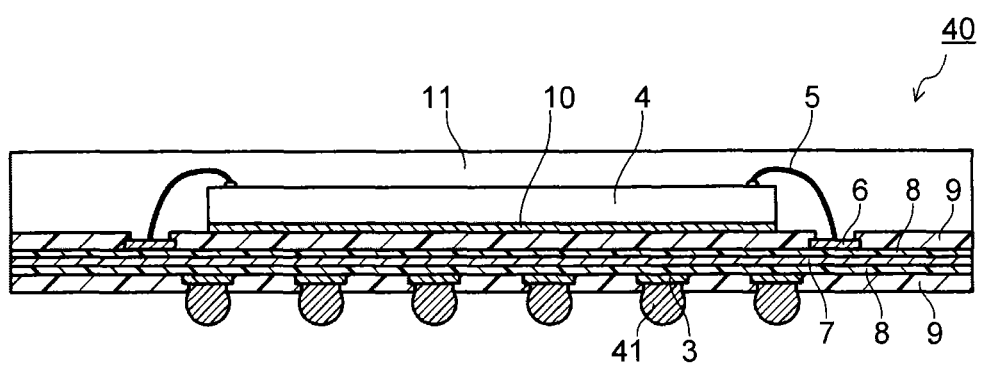
FIG. 13 is a sectional view illustrating an object used in a manufacturing method of a third embodiment.
Figure 14:
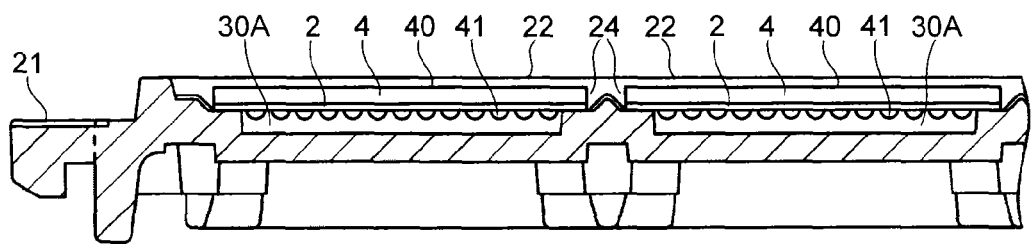
FIG. 14 is a sectional view illustrating a first example of the manufacturing process of the semiconductor device according to the third embodiment.
Figure 15:
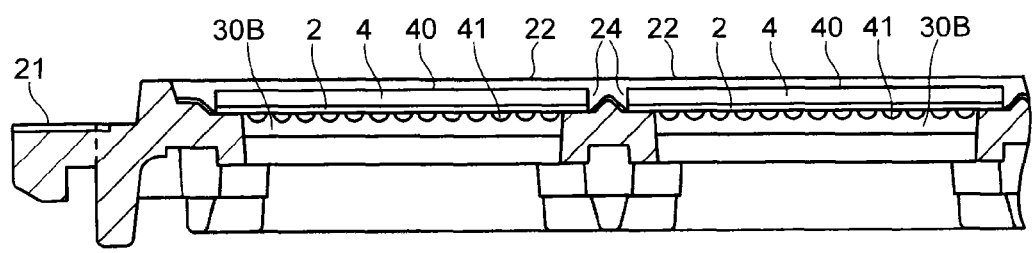
FIG. 15 is a sectional view illustrating a second example of the manufacturing process of the semiconductor device according to the third embodiment.

Next, a manufacturing method of a third embodiment will be described with reference to FIG. 13 to FIG. 15. FIG. 13 is a cross-sectional view of a semiconductor package used as an object to be processed in a manufacturing process of a semiconductor device, and FIG. 14 and FIG. 15 show the manufacturing processes of the semiconductor device using the object shown in FIG. 13.
(Object to be Processed)

In the manufacturing method of the third embodiment, the depressed portion 30 in the tray 21 in the first embodiment is used as a housing portion of bump electrodes of a BGA type semiconductor package. A tray 21 used in the manufacturing process in the third embodiment has the same structure as that of the trays 21 of the first and second embodiments except that the depressed portion 30 is used as the housing portion of the bump electrodes. As shown in FIG. 13, a semiconductor package 40 used as the object in the third embodiment has bump electrodes 41 such as a solder bump provided on an external connection terminal 8 of a wiring board 2.
(Manufacturing Method of Semiconductor Device)

Next, a manufacturing process of a semiconductor device 1 according to the third embodiment will be described. As shown in FIG. 14 and FIG. 15, the semiconductor packages 40 are disposed in housing parts 22 of the trays 21 while housing the bump electrodes 41 in the depressed portions 30 (30A, 30B). The depressed portion housing the bump electrodes 41 can be either of a non-penetrating hole 30A and a penetrating hole 30B. Similarly to in the first and second embodiments, the semiconductor package 40 is sent to a sputtering step in a state of being housed in the tray 21, and is subjected to the sputtering step in that state. The sputtering step is performed similarly to in the first and second embodiments. The conductive shield layer 5 covering the upper surface and the side surfaces of the sealing resin layer 4 and the side surfaces of the wiring board 2 is formed by the sputtering step.

If the bump electrodes 41 are formed after the semiconductor package 40 is divided in pieces, a manufacturing cost of the bump electrodes 41 increases substantially. The bump electrodes 41 are preferable to be formed before the semiconductor package 40 is divided in pieces. Though it is conceived to perform a sputtering step while a forming surface side of the bump electrodes 41 of the semiconductor package 40 after dividing in pieces is held by an adhesive sheet, there is a high possibility that a sputtered film comes in the forming surface side of the bump electrode 41 in such a case.

By using the tray 21 having the depressed portions 30 (30A, 30B), it is possible to apply a sputtering step similar to that for the semiconductor package 20 which does not have the bump electrodes 41 to the semiconductor package 40 which has the bump electrode 41 in the form of individual piece. Thereby, the conductive shield layer 5 can be formed well to the semiconductor package 40 having the bump electrode 41 in the sputtering step. Further, when compared with a case where bump electrodes 41 is formed after a semiconductor package 40 is divided in pieces, a manufacturing cost of a semiconductor device having a conductive shield layer 5 can be reduced. Other effects are similar to those of the first and second embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method of a semiconductor device, comprising:
    preparing a plurality of objects to be processed each including a wiring board, a semiconductor chip mounted on the wiring board, and a sealing resin layer sealing the semiconductor chip;
    preparing a tray including a plurality of housing parts, and depressed portions provided in the plurality of the housing parts respectively and having non-penetrating shapes;
    disposing, in each of the plurality of housing parts of the tray, the object so that an upper surface and side surfaces of the sealing resin layer and at least a part of side surfaces of the wiring board when a surface of the wiring board on which the semiconductor chip is mounted is defined as an upper side are exposed;
    disposing the tray in which the objects are housed on a table of a sputtering apparatus; and
    forming a conductive shield layer which covers the upper surface and the side surfaces of the sealing resin layer and the at least a part of the side surfaces of the wiring board by sputtering a metal material on the object housed in each of the housing parts of the tray in the sputtering apparatus.

2. The manufacturing method according to claim 1, wherein the housing part has a recessed portion having a rectangular planar shape larger than the object and positioning portions provided in the recessed portion and positioning the object.

3. The manufacturing method according to claim 1, wherein the housing part includes a recessed portion having a rectangular bottom surface and four wall portions provided along at least a part of each of four outer edges of the bottom surface, and positioning portions provided in the wall portions and positioning the object.

4. The manufacturing method according to claim 3, wherein the tray has a position correction part provided in a lower surface side of the tray in a manner to correspond to the wall portion and having a taper portion, and wherein, when a plurality of the trays are stacked, a position of the object housed in the tray in a lower stage side is corrected by the taper portion of the position correction part of the tray in an upper stage side.

5. The manufacturing method according to claim 3, wherein the positioning portions have ribs provided in a manner to project from the four wall portions toward an inner side of the recessed portion respectively.

6. The manufacturing method according to claim 3, wherein the positioning portions have inclined portions provided by inclining wall surfaces of the four wall portions respectively to make an entire shape of the recessed portion in a plan view to be larger than the bottom surface.

7. The manufacturing method according to claim 3, wherein the four wall portions are partially provided along the part of each of the four outer edges of the bottom surface, and wherein each of the positioning portions has ribs provided in both ends of the four wall portions respectively in a manner to project from the four wall portions toward an inner side of the recessed portion respectively.

8. The manufacturing method according to claim 1, wherein the object further has a bump electrode provided in a surface opposite to a surface of the wiring board on which the semiconductor chip is mounted, and wherein the object is disposed in the housing part while fitting the bump electrode in the depressed portion.

9. The manufacturing method according to claim 1, wherein the wiring board has an insulating substrate, and a wiring network provided in at least one of a surface and an inside of the insulating substrate and including a ground wiring line, wherein a part of the ground wiring line is exposed to a side surface of the insulating substrate, and wherein the conductive shield layer is formed to be electrically connected with the part of the ground wiring line exposed to the side surface of the insulating substrate.

10. The manufacturing method according to claim 1, wherein the conductive shield layer contains at least one metal selected from the group consisting of copper, silver, and nickel.

* * * * *